(12) United States Patent
Huang (10) Patent No.: US 7,925,961 B2
(45) Date of Patent: *Apr. 12, 2011

(54) ADAPTIVE ERROR CORRECTION

(75) Inventor: Renxiang Huang, Sunnyvale, CA (US)

(73) Assignee: Sprint Communications Company L.P., Overland Park, KS (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/566,746

(22) Filed: Sep. 25, 2009

(65) Prior Publication Data

US 2010/0017685 A1    Jan. 21, 2010

Related U.S. Application Data

(63) Continuation of application No. 11/302,101, filed on Dec. 13, 2005, now Pat. No. 7,617,434.

(51) Int. Cl.
*H03M 13/35* (2006.01)
(52) U.S. Cl. .................................................. 714/774
(58) Field of Classification Search .................. 714/774
See application file for complete search history.

(56) References Cited

U.S. PATENT DOCUMENTS

| | | | |
|---|---|---|---|
| 5,600,663 | A | 2/1997 | Ayanoglu et al. |
| 6,697,996 | B2 | 2/2004 | Chethik |
| 6,745,364 | B2 | 6/2004 | Bhatt et al. |
| 2005/0039103 | A1 | 2/2005 | Azenko et al. |

OTHER PUBLICATIONS

Wu, et al., "Integrated Packet Loss and Error Control Schemes in Wireless Multimedia Data Links", GLOBECOM '01, 2001, pp. 685-689.*
PRO-MPEG, "Transmission of High Bit Rate Studio Streams over IP Networks," Pro-MPEG Forum, Jul. 2004, pp. 1-8, Pro-MPEG code of Practice #4 release 1.
PRO-MPEG, "Transmission of Professional MPEG-2 Transport Streams over IP Networks," Pro-MPEG Forum, Jul. 2004, pp. 1-17, Pro-MPEG Code of Practice #3 release 2.
Michael B. Pursley, et al., "Adaptive-Rate Turbo Product Coding for Frequency-Hop Transmission and Time-Varying Partial-Band Interference," MILCOM 2003, Oct. 2003, pp. 446-451, Clemson University, Clemson, South Carolina.
Kazunori Shimizu, et al., "Reconfigurable Adaptive FEC System Based on Reed-Solomon Code with Interleaving," IEICE Trans. Inf. & Syst., Jul. 2005, pp. 1526-1537, vol. E88-D, No. 7, The Institute of Electronics, Information and Communication Engineers.

* cited by examiner

*Primary Examiner* — Stephen M Baker

(57) ABSTRACT

A transmitter generates error correction data according to an error correction scheme that logically arranges the communication data in a number of rows and a number of columns. The transmitter transmits the communication data and the error correction data. A receiver receives the communication data and the error correction data. The receiver processes the error correction data to correct errors in the communication data. The receiver generates information regarding the errors in the communication data. The transmitter processes the information to alter at the number of rows and/or the number of columns.

20 Claims, 8 Drawing Sheets

ADAPTIVE ERROR CORRECTION

RELATED APPLICATIONS

This patent application is a continuation of patent application Ser. No. 11/302,101, entitled "Adaptive Error Correction", filed on Dec. 13, 2005, and hereby incorporated by reference into this patent application.

FEDERALLY SPONSORED RESEARCH OR DEVELOPMENT

Not applicable.

MICROFICHE APPENDIX

Not applicable.

BACKGROUND OF THE INVENTION

1. Field of the Invention

Aspects of the invention relate generally to data communication systems and more particularly to adaptive error correction in data communication systems.

2. Description of the Prior Art

Figure 1:
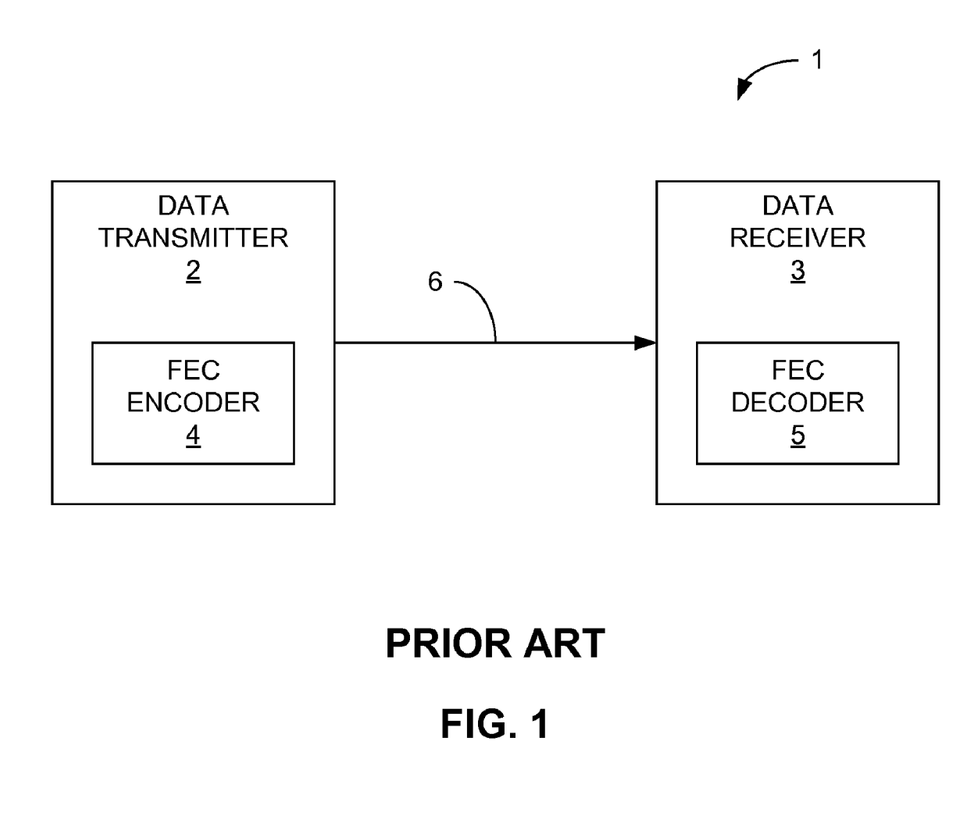
FIG. 1 is a simplified block diagram of a data communication system from the prior art.

Data communication systems are commonly utilized for transferring any kind of data, including, but not limited to, audio, video, text, numerical, and myriad other types of data. Typically, as shown in FIG. 1, a data communication system 1 includes a data transmitter 2 which transfers data over a communication link 6 to a data receiver 3. The communication link 6 may be a wireline link, a wireless link, a fiber optic link, or any other form of connection employable for communication. The link 6 may also include one or more intermediate devices, such as switches, routers, relays, and the like employed in a computer or communication network, for transferring communication data from the transmitter 2 to the receiver 3.

Regardless of the type of communication link 6 utilized, the possibility exists that the data may be corrupted over the communication link 6 between the time the transmitter 2 transfers the data, and the time the receiver 3 accepts the data. Such corruption most often occurs as a result of traffic congestion, thus causing queue overflow resulting in lost data. In other cases, data corruption may result from electrical noise, adverse atmospheric conditions, defects suffered by devices employed in the communication link 6, and many other sources.

To prevent the communication data from being corrupted in the presence of adverse conditions, the transmitter 2 and receiver 3 often employ one or more forms of forward error correction, in which the transmitter adds error correction information to the data being transferred. This error correction data often is generated by a forward error correction encoder 4, which utilizes a mathematical algorithm employing the communication data as input. The communication data and the error correction data are then transferred to the receiver 3, which uses an error correction decoder 5 employing an algorithm related to that utilized by the error correction encoder 4 to determine if the communication data exhibits errors. If errors are present, the receiver 3 further employs the algorithm and the error correction data to correct the errors in the communication data. The number of errors correctable by use of the error correction data is typically limited in some fashion, and often depends in part on the amount of error correction data compared to the amount of communication data being protected. Generally, the higher the amount of error correction data, the higher the number of errors in the communication data that may be corrected.

Figure 2:
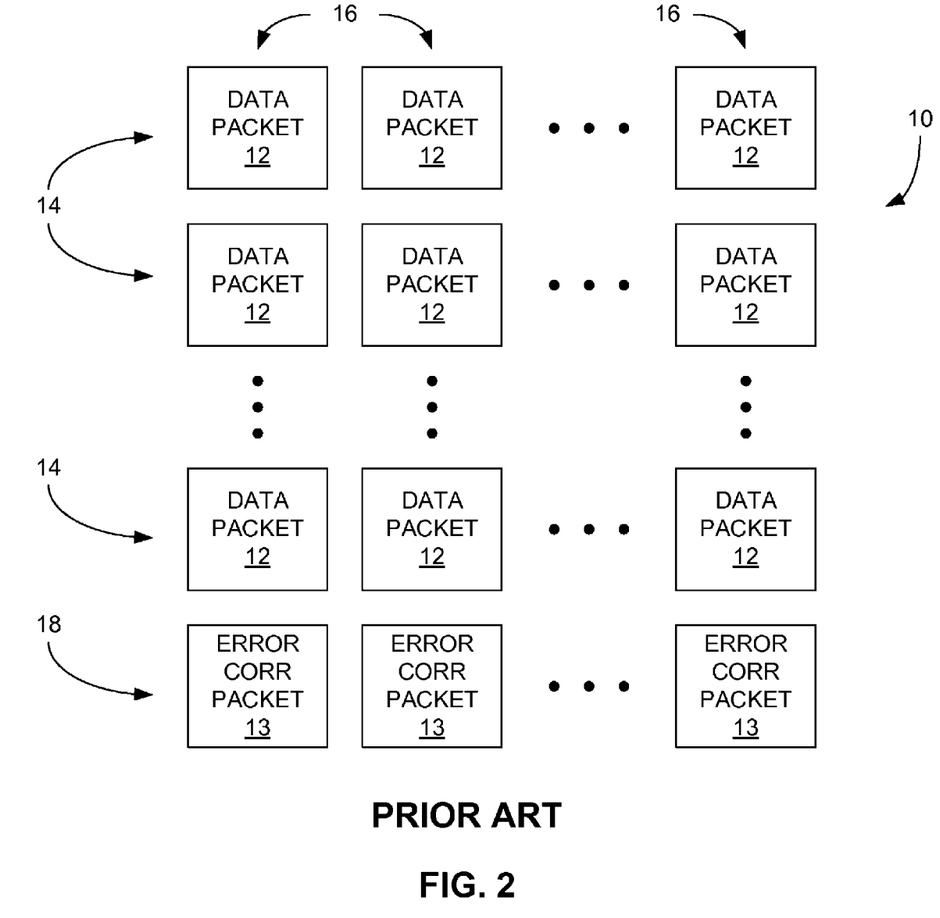
FIG. 2 is a block diagram of a data frame from the prior art employing a single-stream error correction mode.

One particular single-stream forward error correction scheme currently employed results in a data frame 10 shown graphically in the block diagram of FIG. 2. The data frame 10, which is one possible organization of data for transmission over the communication link 6 of FIG. 1, includes a group of data packets 12 arranged in a number of rows 14 and a number of columns 16. In this particular scheme, the data packets 12, which carry the communication data transferred from a transmitter 2 to a receiver 3, are transferred in order starting in the first row 14, from left to right, then proceeding to the next row in the same fashion, and continuing row by row. After all rows of data packets 12 have been transferred, a row 18 of error correction data packets 13 is transferred thereafter. In other examples, the error correction data packets 13 are interleaved among the data packets 12 during transfer. In this example, the information in each error correction packet 13 provides the ability to correct errors in the data packets within its corresponding column 16. In one implementation, the error corrections packets 13 are generated from a bitwise exclusive-OR (XOR) operation across each of the data packets 12 within a particular column 16. In other implementations, a more sophisticated algorithm, such as a Reed-Solomon (RS) error correction code (ECC), may be employed. Other possible algorithms exist as well.

Figure 3:
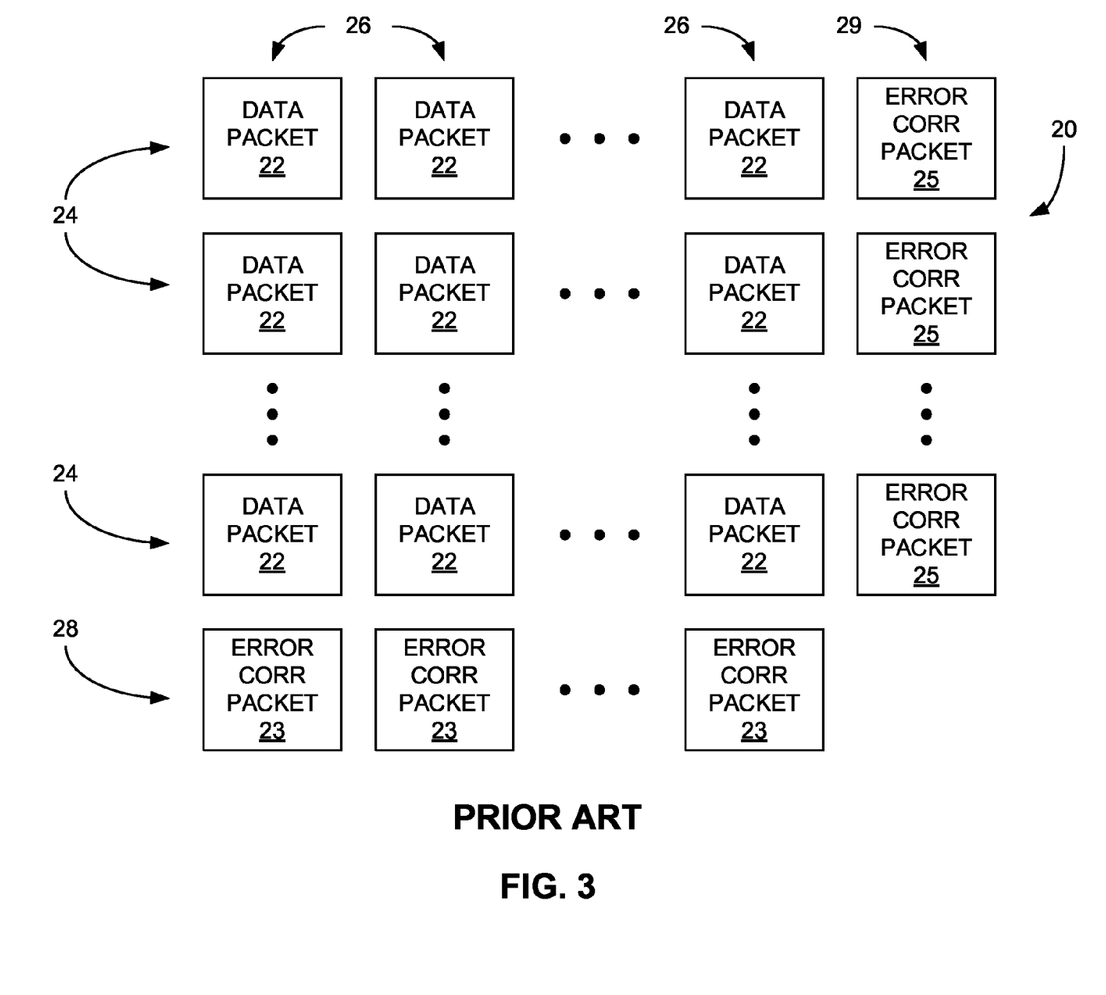
FIG. 3 is a block diagram of a data frame from the prior art employing a dual-stream error correction mode.

In another example, provided in FIG. 3, a data frame 20 employing a dual-stream forward error correction scheme provides rows 24 and columns 26 of communication data packets 22. Also, a row 28 of error correction packets 23 is provided, whereby each error correction packet 23 supplies some level of correction for the data packets 22 of its associated column 26. In addition, a column 29 of error correction packets 23 provides data for correcting the data packets 22 of each row 24 of the frame 20. Thus, associated with each data packet 26 are two error correction packets 23 employable for the correction of that packet 26.

Unfortunately, the addition of error correction packets or other forms of error correction data to the communication data negatively affects the overall effective throughput and latency of the communication link 6 shown in FIG. 1. In other words, the throughput of the link 6 is decreased as more error correction data is added, since more bandwidth of the link 6 must be expended for transfer of the error communication data to the receiver 3. Also, since the receiver 3 must wait for all error correction data associated with a particular set of communication data to be received before completely determining if the communication data contains errors, some delay is introduced into the overall data transmission time. More specifically, the time elapsed during transmission of all communication and error correction data from the transmitter 2 to the receiver expands as the amount of error correction data increases.

Adverse conditions affecting the "raw," or uncorrected, error rate of a particular communication link 6 often change over time. Thus, the raw error rate of the communication data may fluctuate in a corresponding manner. However, the algorithms and the amount of error correction data employed by a particular data communication system 1 typically remain unchanged, thus not being modified to adjust to changing conditions over the communication link 6 that may alter the number of errors being imposed on the communication data between the transmitter 2 and the receiver 3. As a result, a particular error correction scheme capable of correcting errors under more adverse circumstances may employ an unnecessary amount of error correction data during periods when the raw error rate of the communication link 6 is low.

Conversely, an error correction scheme suitable for a normally low data error rate may not exhibit an acceptable error correction capacity for periods of increased raw error rates, thus possibly rendering at least some of the communication data from the transmitter 2 uncorrectable at the receiver 3.

SUMMARY OF THE INVENTION

One embodiment of the invention provides a method for transferring communication data of one or more data frames. Each data frame includes data packets logically arranged in a number of rows and a number of columns, and further includes error correction packets associated with the data packets. The error correction packets are generated according to an error correction scheme based on the number of rows and the number of columns. The data frames are transmitted and received. The error correction packets are then processed to correct errors in the data packets. Information regarding the errors in the data packets is generated. The information is processed to alter at least one of the number of rows and the number of columns.

Another embodiment of the invention is a data communication system including a data transmitter and a data receiver. The data transmitter is configured to transmit data frames, wherein each data frame includes data packets logically arranged in a number of rows and a number of columns, and further includes error correction packets associated with the data packets. The data transmitter includes an error correction encoder configured to generate the error correction packets according to an error correction scheme based on the number of rows and columns. The data receiver is configured to receive the data frames, and includes an error correction decoder configured to process the error correction packets to correct errors in the data packets, generate information regarding the errors in the data packets, and transmit the information to the data transmitter. The error correction encoder of the data transmitter processes the information to alter at least one of the number of rows and the number of columns.

Another embodiment of the invention provides a method for transferring communication data. A transmitter generates error correction data according to an error correction scheme that logically arranges the communication data in a number of rows and a number of columns. The transmitter transmits the communication data and the error correction data. A receiver receives the communication data and the error correction data. The receiver processes the error correction data to correct errors in the communication data. The receiver generates information regarding the errors in the communication data. The transmitter processes the information to alter at the number of rows and/or the number of columns.

Additional embodiments and advantages of the present invention will be realized by those skilled in the art upon perusal of the following detailed description, taken in conjunction with the accompanying drawings.

DETAILED DESCRIPTION OF THE INVENTION

Figure 4:
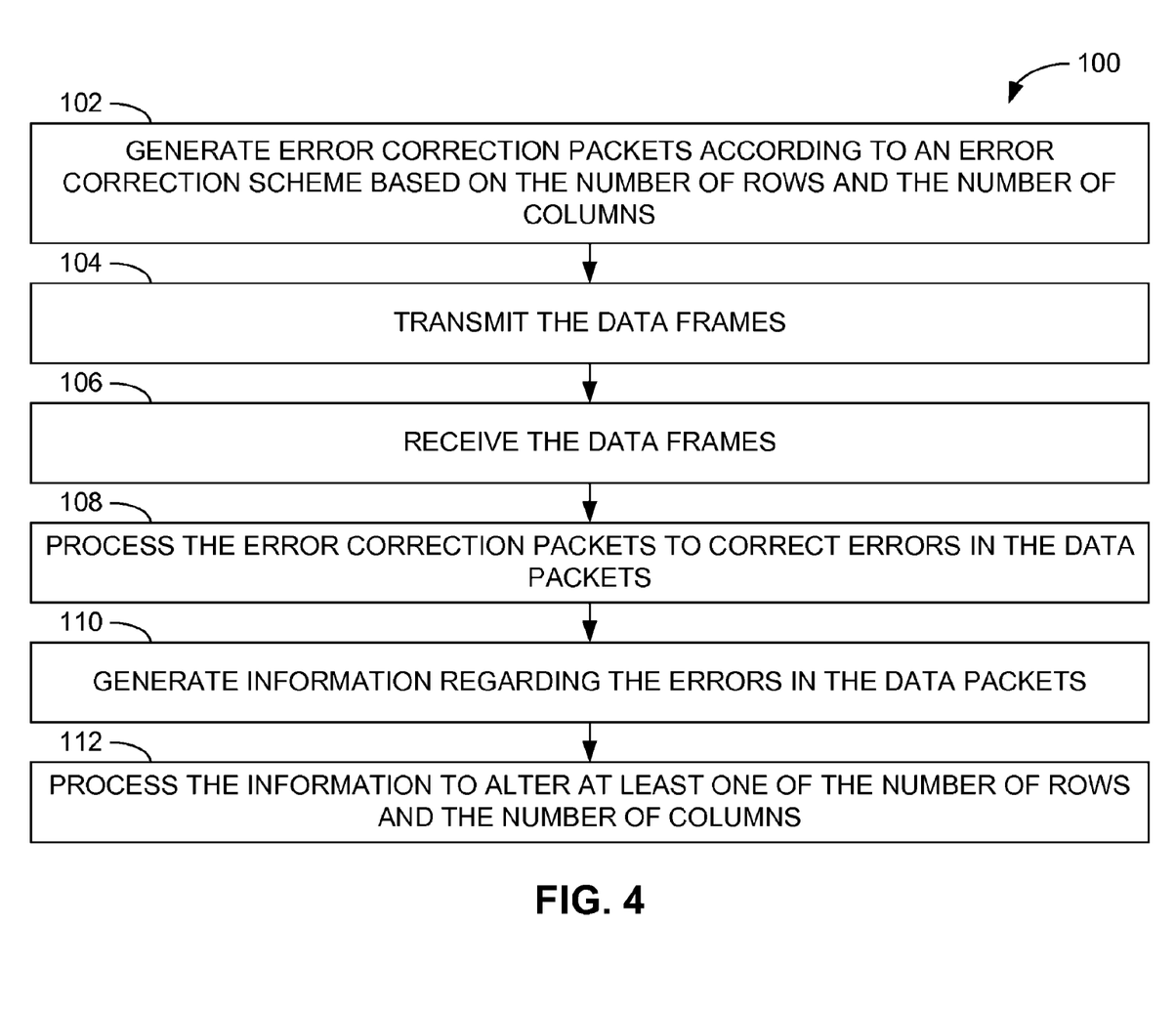
FIG. 4 is a flow diagram of a method for transferring and correcting communication data according to an embodiment of the invention.

FIG. 4 provides a flow diagram of a method 100 of transferring and correcting communication data including one or more data frames according to one embodiment of the invention. Each data frame includes data packets logically arranged in a number of rows and a number of columns, as well as error correction packets associated with the data packets. The error correction packets are generated according to an error correction scheme based on the number of rows and the number of columns (operation 102). The data frames are transmitted (operation 104) and received (operation 106). The error correction packets are processed to correct errors in the data packets (operation 108). Information regarding uncorrectable errors in the data packets is then generated (operation 110). The information is then processed to alter at least one of the number of rows and the number of columns (operation 112).

Figure 5:
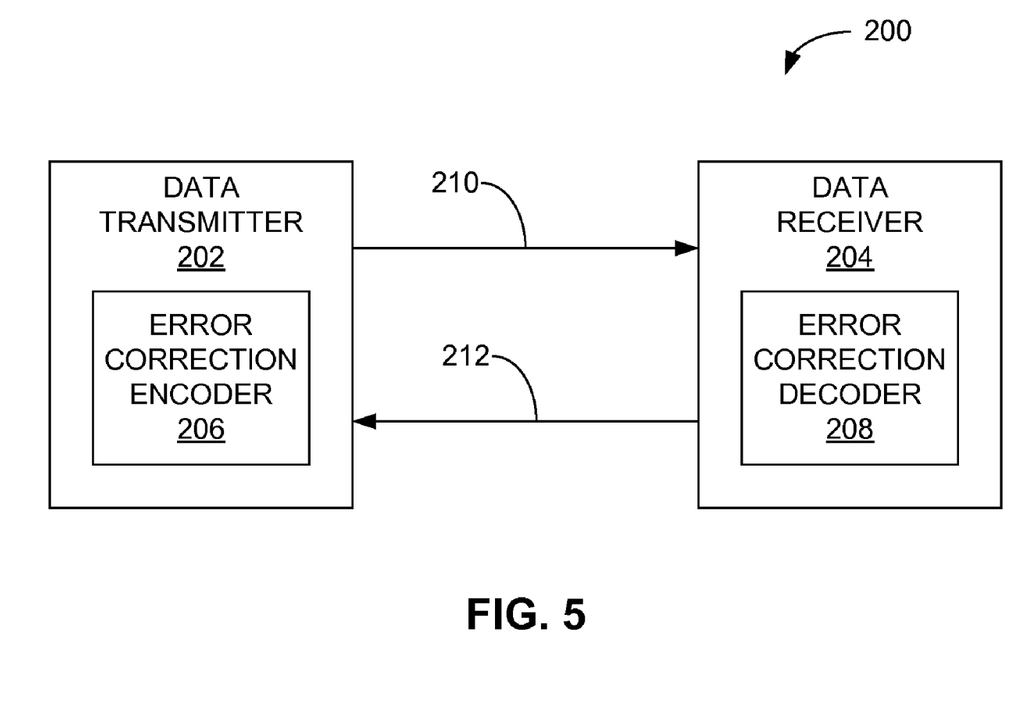
FIG. 5 is a block diagram of a data communication system according to an embodiment of the invention.

Similarly, FIG. 5 provides a simplified block diagram of a data communication system 200 including a data transmitter 202 and a data receiver 204. The data transmitter 202 is configured to transmit data frames having data packets logically arranged in a number of rows and a number of columns. Each data frame also contains error correction packets associated with the data packets. The data transmitter 202 includes an error correction encoder 206 configured to generate the error correction packets according to an error correction scheme based on the number of rows and the number of columns. The flow of the data frames is portrayed graphically by way of a communication path 210 in FIG. 5.

The data receiver 204 is configured to receive the data frames. Included with the data receiver 204 is an error correction decoder 208 configured to process the error correction packets to correct errors in the data packets, to generate information regarding uncorrectable errors in the data packets, and transmit the information to the data transmitter 202. The direction of flow of the uncorrectable error information is shown graphically via path 212. The error correction encoder 206 processes this information to alter at least one of the number of rows and the number of columns.

Figure 6:
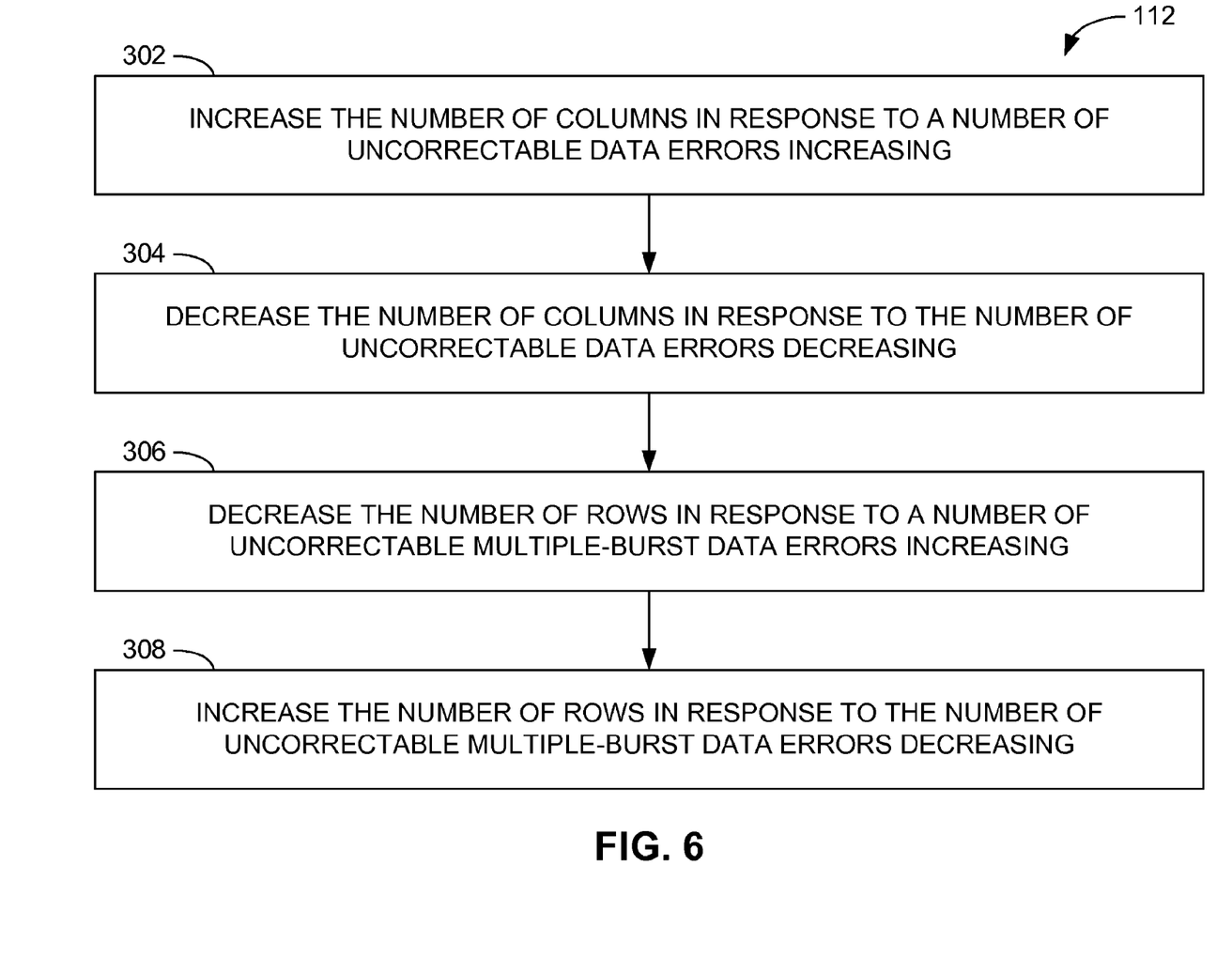
FIG. 6 is a flow diagram of a method for altering the number of rows and/or the number of columns of a data frame according to an embodiment of the invention.

FIG. 6 provides a particular implementation for processing the information regarding uncorrectable errors to alter the number of rows and/or columns of subsequent data frames. Two examples of a two-dimensional matrix format employing rows and columns have been provided earlier, as shown in FIGS. 2 and 3. One particular use for such data frames is video data, such as Motion Picture Expert Group (MPEG) data transferred over a computer or other communication network. Various standards regarding the use of video data frames are further described, for example, in the "Pro-MPEG Code of Practice #3, Release 2" (2004), provided by the Pro-MPEG Forum, and incorporated herein by reference in its entirety. However, other forms of data, such as audio, text, numerical, and others may also be transferred and corrected under the methods and systems described herein. Also, examples described herein employ the single-stream forward error correction scheme described in FIG. 2. However, any error correction scheme employing a two-dimensional array of data packets for error correction purposes may also benefit from various aspects of the embodiments described below.

As described above in reference to FIG. 2, the data packets 12 are transferred in row order, starting with the leftmost data packet 12 of the first row 14, and progressing along the first row 14 from left to right, and then continuing with the leftmost data packet 12 of the second row 14, proceeding in like fashion until all data packets 12 are transferred. Each data packet 12 includes at least one byte of data, and may include hundreds or thousands of bytes in many typical implementations. Each column 16 of data packets 12 is associated with an error correction packet 13. The error correction packets 13 collectively form a separate row 18 of error correction packets 13 which are transferred after the data packets 12.

In other embodiments, the transfer order of the data packets may be any order previously agreed upon between a transmitter and a receiver of the data frames. For example, the error correction packets 13 may be interleaved among the data packets 12 in some regular fashion, as opposed to forming the separate row 18 of error correction packets 13. Also, the data packets 12 may be transferred in a different order from that indicated in FIG. 2. However, no matter what order the data packets 12 and error correction packets 13 are transferred, the logical organization as a two-dimensional array is maintained, as the dimensions of the array determine to an extent the operation and resulting capabilities of the error correction scheme being employed, as described in greater detail below.

In one example, each bit of a particular error correction packet 13 represents a bitwise-XOR operation across the corresponding bit of each data packet 12 within the same column 16 as the error correction packet 13. Thus, in this specific example, each error correction packet 13 is capable of correcting at most one data packet 12. As a result, at most one data packet 12 in each column 16 of each data frame 10 may be corrected. Therefore, any more than one erroneous data packet 12 in any column 16 will result in uncorrectable data errors in that particular column 16. In other implementations involving more robust error correction algorithms, such as Reed-Solomon codes, multiple data packets 12 per column 16 may be corrected.

The ability of the error correction scheme of FIG. 2 to correct errors, as well as the amount of overhead and latency involved in transferring the data packets 12 from a transmitter to a receiver, is related to or based upon the number of rows 14 and the number of columns 16 of the data frame 10. More specifically, as the number of columns 16 increases, the greater the number of erroneous data packets 12 that can be corrected, provided that each of the erroneous data packets 12 lies within a separate column 16 of the data frame 10. Thus, the number of columns 16 places a limit on the number of data packets 12 that are correctable in a single data frame 10, as well as the length of a single-burst error involving a number of erroneous data packets 12 in succession. In other words, burst errors within a single data frame 10 involving a number of consecutive or contiguous data packets 12 higher than the number of columns 16 of the data frame 10 will remain uncorrectable. The number of data packets 12 involved in a single-burst error is sometimes termed the "loss period."

To compensate for such uncorrectable data errors, a data frame 10 may employ a greater number of columns 16 to increase both the number of correctable erroneous data packets 12 lying in separate columns, as well as the number of consecutive erroneous data packets 12 that are correctable. Since each additional column 16 provides the same ratio of data packets 12 to error correction packets 13, the total amount of overhead, definable as the number of error correction packets 13 to data packets 12, remains constant. However, as each data frame thus includes more data packets 12 and error correction packets 13 per data frame 10, the total latency for each frame 10 increases. While error correction may begin for portions of the data frame 10 while the data frame 10 is in the process of being transferred, the entire frame 10 typically must be received by a receiver 204 before error correction for the frame 10 may be completed.

In some environments, the errors encountered in data packets 12 over a communication link 210 are more random or isolated. In that case, a lower number of rows 14 for each data frame 10 will result in fewer data packets 12 in each column 14, therefore increasing the ability of the error correction scheme to correct more frequent random erroneous data packets 12. However, the overhead involved with each data frame 10 will increase as a result, although the overall latency or delay will be reduced, assuming the number of columns 16 remains constant.

In some systems, such as some video communication systems, overhead, and its associated effect on usable bandwidth of the communication link 210, is a more important concern than the overall latency exhibited by the data frames 10. As a result, providing a higher number of columns 16 in addition to a lower number of rows 14 may result in some random errors being logically "combined" so that they may be processed as single-burst errors. For example, a multiple-burst error consisting of two individual data errors of erroneous data packets 12, each ten data packets 12 in length, separated by twenty error-free data packets 12 (called the "loss distance"), may be processed as a single-burst error of forty data packets 12. Therefore, as long as the number of columns 16 may be increased to forty under the error correction scheme without decreasing the number of rows 14, the overhead of the scheme will remain constant while handling greater numbers of random erroneous data packets 12.

As mentioned above, the number and nature of the errors found in the data packets 12 may change over time. Thus, providing the ability to alter the number of rows 14 and columns 16 of the data frames 10 in accordance with changing conditions over the communication link 210 would be advantageous. In reference to FIG. 6, in one embodiment, processing the uncorrectable error information (operation 112 of FIG. 4) may include increasing the number of columns in response to a number of uncorrectable data errors increasing (operation 302), decreasing a number of columns in response to the number of uncorrectable data errors decreasing (operation 304), decreasing the number of rows in response to a number of uncorrectable multiple-burst data errors increasing (operation 306), and increasing the number of rows in response to the number of uncorrectable multiple-burst data errors decreasing (operation 308).

In one implementation, uncorrectable single-burst data errors may be those errors involving a number of contiguous erroneous data packets 12 greater than the number of columns 16 of a data frame 10. In other examples, the uncorrectable single-burst data errors may include two or more sets of contiguous erroneous data packets 12 which, when including the loss distances between the sets, span a distance greater than the number of columns 16.

Figure 7A:
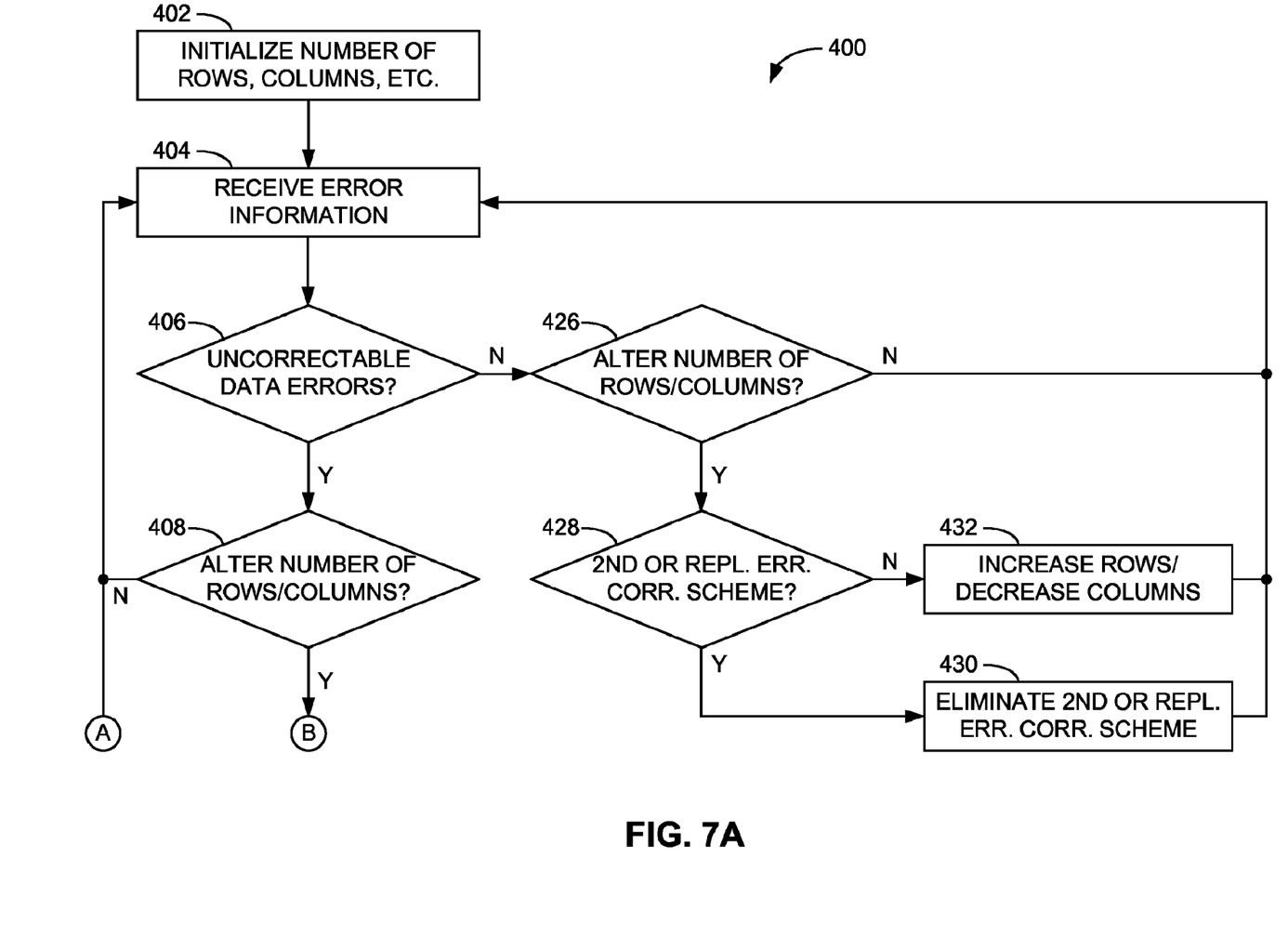
FIGS. 7A-7B provide a flow diagram of a method for altering the number of rows and/or the number of columns of a data frame according to another embodiment of the invention.
Figure 7B:
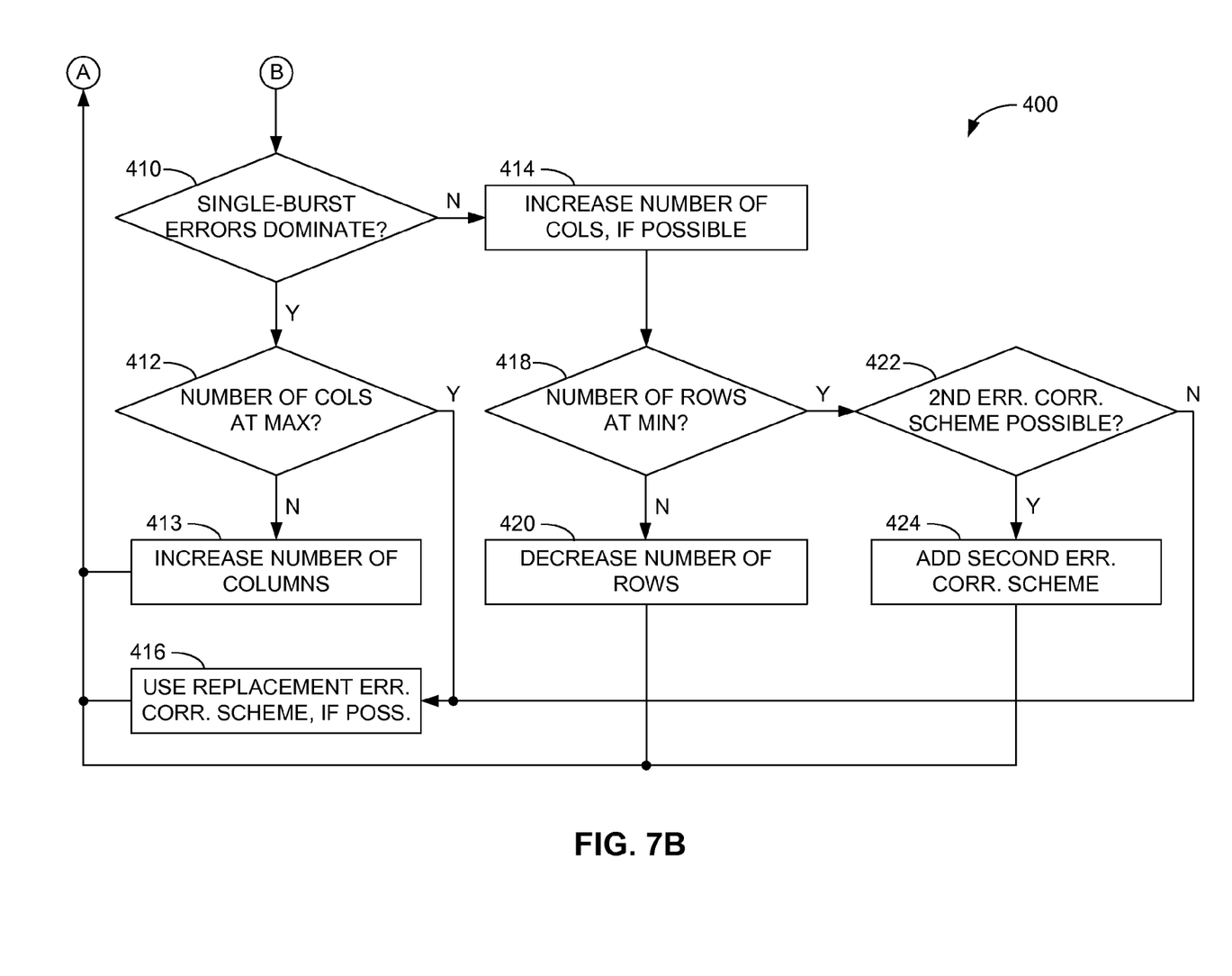

FIGS. 7A-7B provide a flow diagram of one example of a method 400 for altering the number of rows 14 and/or columns 16 of a data frame 10, as well as possibly modifying other aspects of the error correction scheme, in response to error correction information. For example, various aspects of the error correction scheme may be initialized prior to the generation of the error correction packets 13 (operation 402). In one embodiment, the number of columns 16 of the data frame 10 is initially set to some minimum number of columns prior to generating error correction packets 13 for data frames 10, while the number of rows 14 is set to some predetermined maximum number of rows. As a result, the minimum amount of overhead for the data frame 10 is realized, while the delay associated with that particular initial amount of overhead is minimized. Also, the initial error correction mode may be defined as a single-stream error correction mode in which the error correction packets 13 only correct data packets 12 along the columns 16 of each data frame 10 by way of bitwise XOR processing, as described above and shown in FIG. 2.

During normal operation, data frames 10, including data packets 12 and error correction packets 13, are transferred from the data transmitter 202 to the data receiver 204, as mentioned above. In response, the error correction encoder 206 receives error information pertaining to the transferred data frames 10 from the error correction decoder 208 (operation 404). The error correction encoder 206 employs the information to determine whether a change in the number of rows 14 or the number of columns 16 of subsequent data frames 10 is warranted to adapt to changes in the raw error rate of the data frames 10 (operations 406 and thereafter).

In one embodiment, the error correction encoder 206 determines whether uncorrectable data errors are being detected by the error correction decoder 208 (operation 406). If so, the error correction encoder 206 then determines whether an alteration in the number of rows 14 or columns 16 to compensate for the uncorrectable data errors is warranted (operation 408). In one embodiment, the error correction encoder 206 determines whether the average time between uncorrectable data errors falls below a first threshold, and whether the number of unrecoverable data errors exceeds a second threshold. If both conditions are met, the error correction encoder 206 begins the process of altering the number of rows 14, the number of columns 16, or both. Otherwise, the current number of rows 14 and columns 16 is maintained in the short term.

Assuming alteration of the number of rows 14 and/or columns 16 is desired, the error correction encoder 206 determines whether the uncorrectable data errors detected by the error correction decoder 208 are either single-burst-dominant or multiple-burst-dominant (operation 410). In one embodiment, the uncorrectable single-burst data errors dominate if they comprise the majority of the uncorrectable data errors detected by the error correction decoder 208.

In one implementation, the error correction decoder 208 denotes an uncorrectable single-burst data error as one which affects a contiguous number of data packets 12 longer than the current number of columns 16. Also considered an uncorrectable single-burst data error may be two uncorrectable data errors whose loss distance (i.e., the number of error-free data packets therebetween) is less than the product of the number of rows 14 and the number of columns 16, and the total of the loss distance and the loss period of the two errors is greater than the current number of columns 16, but less than or equal to the maximum number of columns 16 attainable. Uncorrectable data errors in groups of three or more may be considered uncorrectable singe-burst data errors in a similar manner. In one embodiment, all other uncorrectable data errors may be considered uncorrectable multiple-burst data errors.

In one embodiment, the error correction encoder 206 attempts to increase the number of columns 16, regardless of whether the uncorrectable data errors are single-burst-dominant or multiple-burst dominant (operations 412, 413, 414). In a particular implementation, the number of columns may be restricted to certain a predetermined maximum value. In that case, the number of columns 16 may be increased to the greater of the next largest column value allowed, and a median length of the uncorrectable single-burst data errors. In doing so, the error correction encoder 206 attempts to make such errors correctable without increasing the delay inherent in the data frames 10 unnecessarily.

If the uncorrectable data errors are single-burst-dominant, and the number of columns 16 has already been increased to its maximum allowable value (operation 412), the error correction encoder 206 may attempt to replace the current error correction mode with a more robust mode (operation 416). For example, the current error correction mode may be capable of correcting no more than a single data packet 12 in each column 16 of a data frame 10, such as a bitwise-XOR error correction mode. In some examples, the error correction encoder 206 may replace this mode with a Reed-Solomon error correction mode or similar scheme capable of correcting more than one data packet 12 per column 16.

In one embodiment, if the uncorrectable data errors are multiple-burst-dominant, the error correction encoder 206 will attempt to decrease the number of rows 14 in addition to increasing the number of columns 16 (operations 418, 420). In this case, the number of rows may be decreased to the next smallest row value allowed.

In one embodiment, an increase in the number of columns 16 may be coordinated with a decrease in the number of rows 14 in the case the uncorrectable data errors are deemed to be multiple-burst-dominant. In that situation, the number of columns 16 may be increased to the larger of a minimum number of columns 16 allowed, and the ceiling of (i.e., the smaller integer greater than) the current number of columns 16, multiplied by the previous or old number of rows 14, divided by the current or updated number of rows 14.

If the number of rows 14 is already at a minimum allowed value, the error correction encoder 206 may attempt to implement a second error correction mode in addition to the original mode (operation 422). For example, a column of error correction packets 13 such as those shown in FIG. 3, in which each error correction packet 13 in that column corrects data packets 12 within its associated row 14, may be added in one embodiment (operation 424). If use of such a dual-mode error correction is not practical, the error correction encoder 206 may instead attempt to replace the current error correction mode with a more robust method, as described above (operation 416). In other implementations, neither method of enhanced error recovery may be employed.

Not only may the number of columns 16 be increased and the number of rows 14 decreased in response to uncorrectable data errors being detected by the error correction decoder 208, but the process may be reversed as well. In other words, as time passes without unrecoverable data errors being encountered, the previous changes in the number of rows 14 and columns 16 may be reversed.

In one embodiment, such modification of the number of rows 14 or columns 16 may be allowed when the current number of columns 16 compared to a maximum detected burst length or loss period since the last modification is greater than a predetermined ratio (operation 426). For example, if this ratio is two, the current number of columns 16 would need to be at least twice the maximum burst length before relaxation of the capability of the error correction scheme would be allowed.

If the above ratio has been attained, the error correction encoder 206 may first determine if a second error correction mode or a replacement error correction mode has been employed (operation 428). If so, the second error correction mode may be eliminated, or the replacement error correction mode may be reverted back to an original error mode, before alteration of the number of rows 14 and/or columns 16 is allowed (operation 430).

If a second or replacement error correction mode is not currently employed, reduction of the number of columns 16 and/or increasing the number of rows 14 may commence (operation 432). Reducing the number of columns 16 and/or increasing the number of rows 14 may be controlled by any of a number of methods. In one specific implementation, the number of columns 16 may be decreased to the greater of a minimum number of columns 16 allowed, and the maximum detected burst length added to some predetermined percentage of the maximum burst length. For example, if the percentage is set to fifty percent, the new number of columns 16 would then be about fifty percent greater than the maximum burst length. Such a calculation would aid in providing some margin against burst errors of lengths greater than those previously experienced.

Associated with a reduction in the number of columns 16 may be an increase in the number of rows 14 to reduce the amount of overhead imposed by the current error correction scheme. In one embodiment, the number of rows 14 is increased to the lesser of a maximum allowable number of rows, and the floor of (i.e., the largest integer less than) the current number of rows, multiplied by the previous number of columns before reduction, divided by the current number of columns.

In one embodiment, a timer may be reset each time the number of rows 14 or the number of columns 16 has been altered or modified. Future alteration may then be allowed only upon the value of the timer attaining a predetermined time period so that changing the number of rows 14 or columns 16 is allowed only once per time period. Also, this time period may be different depending upon whether uncorrectable data errors are being detected or not, thus indicating whether the overall capability of the error correction scheme is being increased or decreased. For example, if a number of uncorrectable data errors are being detected, the time period for allowing an increase in the number of columns 16 or decrease in the number of rows 14 may be twenty-four hours. However, if uncorrectable data errors are not being detected, thus indicating a decrease in the number of columns 16 or increase in the number of rows 14 is warranted, the time period may instead be seven days in one particular implementation.

While the particular embodiments of FIGS. 6, 7A and 7B indicate use of information strictly related to uncorrectable data errors, other embodiments may be employed which use information regarding correctable data errors, either in addition to uncorrectable data error information, or in lieu of such information. For example, instead making decisions based upon uncorrectable data errors, the error correction encoder 206 may enhance its error correction capabilities based on data errors that are marginally correctable given the current error correction configuration of rows 14 and columns 16.

Various embodiments described herein may be implemented strictly in electronic hardware constituting a data transmitter, a data receiver, or other communication or computing devices. Alternative embodiments may be implemented strictly in software or firmware, or by way of a combination of hardware, software, firmware and the like. Such software or firmware may contain instructions executable on a single processor or multiple processors capable of performing such instructions. Further, such processors may take the form of general purpose processors, processors designed for a specific application, or any other processor capable of executing the instructions.

While several embodiments of the invention have been discussed herein, other embodiments encompassed within the scope of the invention are possible. For example, while the particular embodiments discussed herein specifically refer to bitwise-XOR or Reed-Solomon error correction, many other types of error correction for data storage or communication applications may be employed while benefiting from use of the various embodiments of the invention described herein. Also, while the data communication systems and methods described make particular reference to video data, any other type of data transferred over a communication link between a transmitter and a receiver may be carried within the data frames described above. In addition, aspects of one embodiment may be combined with aspects of other embodiments disclosed above to produce additional embodiments not heretofore discussed. Thus, while the present invention has been described in the context of specific embodiments, such descriptions are provided for illustration and not limitation. Accordingly, the proper scope of the present invention is delimited only by the following claims.

What is claimed is:

1. A method of transferring and correcting communication data comprising data frames, each data frame comprising data packets logically arranged in a number of rows and a number of columns, each data frame further comprising error correction packets associated with the data packets, the method comprising:
generating the error correction packets according to an error correction scheme based on the number of rows and the number of columns;
transmitting the data frames;
receiving the data frames;
processing the error correction packets to correct errors in the data packets;
generating information regarding the errors in the data packets; and
processing the information to alter at least one of the number of rows and the number of columns.

2. The method of claim 1 wherein the error correction scheme comprises a bitwise exclusive-OR error correction scheme.

3. The method of claim 1 wherein processing the information to alter at least one of the number of rows and the number of columns comprises:
altering the number of rows;
generating additional error correction packets for additional data frames having additional data packets according to the error correction scheme based on the altered number of rows and the number of columns;
transmitting the additional data frames;
receiving the additional data frames; and
processing the additional error correction packets to correct errors in the additional data packets.

4. The method of claim 1 wherein processing the information to alter at least one of the number of rows and the number of columns comprises:
altering the number of columns;
generating additional error correction packets for additional data frames having additional data packets according to the error correction scheme based on the number of rows and the altered number of columns;
transmitting the additional data frames;
receiving the additional data frames; and
processing the additional error correction packets to correct errors in the additional data packets.

5. The method of claim 1 wherein processing the information to alter at least one of the number of rows and the number of columns comprises:
altering the number of rows and the number of columns;

generating additional error correction packets for additional data frames having additional data packets according to the error correction scheme based on the altered number of rows and the altered number of columns;
transmitting the additional data frames;
receiving the additional data frames; and
processing the additional error correction packets to correct errors in the additional data packets.

6. A data communication system comprising:
a data transmitter configured to transmit data frames, each data frame comprising data packets logically arranged in a number of rows and a number of columns, each data frame further comprising error correction packets associated with the data packets, wherein the data transmitter comprises an error correction encoder configured to generate the error correction packets according to an error correction scheme based on the number of rows and the number of columns; and
a data receiver configured to receive the data frames, wherein the data receiver comprises an error correction decoder configured to process the error correction packets to correct errors in the data packets, generate information regarding the errors in the data packets, and transmit the information to the data transmitter;
wherein the error correction encoder is further configured to process the information to alter at least one of the number of rows and the number of columns.

7. The data communication system of claim 6 wherein the error correction scheme comprises a bitwise exclusive-OR error correction scheme.

8. The data communication system of claim 6 wherein:
the error correction encoder is configured to process the information to alter the number of rows;
the data transmitter is configured to transmit additional data frames comprising additional data packets logically arranged in the altered number of rows and the number of columns and comprising additional error correction packets; and
the data receiver is configured to receive the additional data frames and the error correction decoder is configured to process the additional error correction packets to correct errors in the additional data packets.

9. The data communication system of claim 6 wherein:
the error correction encoder is configured to process the information to alter the number of columns;
the data transmitter is configured to transmit additional data frames comprising additional data packets logically arranged in the number of rows and the altered number of columns and comprising additional error correction packets; and
the data receiver is configured to receive the additional data frames and the error correction decoder is configured to process the additional error correction packets to correct errors in the additional data packets.

10. The data communication system of claim 6 wherein:
the error correction encoder is configured to process the information to alter the number of rows and the number of columns;
the data transmitter is configured to transmit additional data frames comprising additional data packets logically arranged in the altered number of rows and the altered number of columns and comprising additional error correction packets; and
the data receiver is configured to receive the additional data frames and the error correction decoder is configured to process the additional error correction packets to correct errors in the additional data packets.

11. A method of transferring and correcting communication data, the method comprising:
generating error correction data according to an error correction scheme that logically arranges the communication data in a number of rows and a number of columns;
transmitting the communication data and the error correction data;
receiving the communication data and the error correction data;
processing the error correction data to correct errors in the communication data;
generating information regarding the errors in the communication data; and
processing the information to alter at least one of the number of rows and the number of columns.

12. The method of claim 11 wherein processing the information to alter at least one of the number of rows and the number of columns comprises:
altering the number of rows;
generating additional error correction data for additional communication data according to the error correction scheme based on the altered number of rows and the number of columns;
transmitting the additional communication data;
receiving the additional communication data; and
processing the additional error correction data to correct errors in the additional communication data.

13. The method of claim 11 wherein processing the information to alter at least one of the number of rows and the number of columns comprises:
altering the number of columns;
generating additional error correction data according to the error correction scheme based on the number of rows and the altered number of columns;
transmitting the additional communication data;
receiving the additional communication data; and
processing the additional error correction data to correct errors in the additional communication data.

14. The method of claim 11 wherein processing the information to alter at least one of the number of rows and the number of columns comprises:
altering the number of rows and the number of columns;
generating additional error correction data according to the error correction scheme based on the altered number of rows and the altered number of columns;
transmitting the additional communication data;
receiving the additional communication data; and
processing the additional error correction data to correct errors in the additional communication data.

15. The method of claim 11 wherein the communication data comprises video data.

16. The method of claim 15 wherein the video data is transmitted in data packets.

17. The method of claim 16 wherein the data packets contain a video frame.

18. The method of claim 17 wherein the video data is comprises Motion Picture Expert Group (MPEG) data.

19. The method of claim 18 wherein the error correction scheme comprises a bitwise exclusive-OR error correction scheme.

20. The method of claim 18 wherein the error correction scheme comprises a Reed-Solomon error correction scheme.

* * * * *